United States Patent [19]

Jinbo

[11] Patent Number: 4,947,056

[45] Date of Patent: Aug. 7, 1990

[54] MOSFET FOR PRODUCING A CONSTANT VOLTAGE

[75] Inventor: Toshikatsu Jinbo, Tokyo, Japan

[73] Assignee: NEC Corporation, Japan

[21] Appl. No.: 335,933

[22] Filed: Apr. 10, 1989

[30] Foreign Application Priority Data

Apr. 12, 1988 [JP] Japan .............................. 63-90518

[51] Int. Cl.[5] .......................... H03K 3/01; G06G 7/10

[52] U.S. Cl. .............................. 307/296.8; 307/491; 323/313

[58] Field of Search ............... 307/296.6, 296.7, 296.8, 307/491, 304; 323/313

[56] References Cited

U.S. PATENT DOCUMENTS

| | | | |
|---|---|---|---|
| 4,686,451 | 8/1987 | Li et al. | 307/296.8 |
| 4,692,689 | 9/1987 | Takemae | 307/296.8 |
| 4,694,199 | 9/1987 | Goetz | 323/313 |
| 4,752,699 | 6/1988 | Cranford, Jr. et al. | 307/296.8 |
| 4,788,455 | 11/1988 | Mori et al. | 307/296.8 |
| 4,833,342 | 5/1989 | Kiryu et al. | 307/296.8 |

FOREIGN PATENT DOCUMENTS 0520674 7/1976 U.S.S.R. .

*Primary Examiner*—Stanley D. Miller
*Assistant Examiner*—Richard Roseen
*Attorney, Agent, or Firm*—Leydig, Voit & Mayer

[57] ABSTRACT

A circuit for producing a constant voltage comprises first and second MOSFETs, and first and second bias voltage producing devices. The first and second MOSFETs to which first and second input voltages are applied, respectively, are connected in series. The first bias voltage producing device produces a potential difference, which is equal to a threshold voltage of the first MOSFET, to be applied across drain and gate of the first MOSFET, and the second bias voltage producing device produces a potential difference, which is equal to a threshold voltage of the second MOSFET, to be applied across drain and gate of the second MOSFET, so that a wide range of an output voltage is produced at a connecting point of the first and second MOSFETs. Even more, the output voltage is stabilized in level, even if the threshold voltages fluctuate in a semiconductor device fabricating process.

4 Claims, 4 Drawing Sheets

MOSFET FOR PRODUCING A CONSTANT VOLTAGE

FIELD OF THE INVENTION

The invention relates to a circuit for producing a constant voltage, and more particularly to a circuit in which a wide range of a voltage is produced with a stabilized characteristic.

BACKGROUND OF THE INVENTION

A circuit for producing a constant voltage is generally used to supply a predetermined voltage, which is different from an externally input voltage, to a semiconductor device. One type of a conventional circuit for producing a constant voltage comprises first and second P type MOS field effect transistors (each defined "P-MOSFET" hereinafter) connected in series. In the circuit, gate and drain of the first P-MOSFET are connected to source and substrate potential of the second P-MOSFET, source and substrate potential of the first P-MOSFET are connected to a first voltage input terminal, and gate and drain of the second P-MOSFET are connected to a second voltage input terminal, wherein a connecting point between the gate and the drain of the first P-MOSFET and the source and the substrate potential of the second P-MOSFET is connected to a constant voltage output terminal.

In operation, first and second voltages $V_1$ and $V_2$ ($V_1 > V_2$) are applied to the first and second voltage input terminals, respectively. A current of the first P-MOSFET is decreased to increase an output voltage at the constant voltage output terminal, and is "zero" when the output voltage ranges a value of $V_1 - |V_{T1}|$ to the voltage $V_1$, where $V_{T1}$ is a threshold voltage of the first P-MOSFET. On the other hand, a current of the second P-MOSFET is "zero" when the the output voltage ranges the voltage $V_2$ to a value of $V_2 + |V_{T2}|$, where $V_{T2}$ is a threshold voltage of the second P-MOSFET, and is increased to increase the output voltage. When the currents of the first and second P-MOSFETs are equal to each other, a predetermined output voltage is obtained at the constant voltage output terminal in a stabilized state.

A stabilized output voltage $V_s$ is defined in the equation (1).

$$V_s = V_2 + |V_{T2}| + \{(V_1 - |V_{T1}|) - (V_2 + |V_{T2}|)\} \times \frac{g_{m1}}{g_{m1} + g_{m2}} \quad (1)$$

where $g_{m1}$ is a mutual transfer conductance of the first P-MOSFET, and $g_{m2}$ is a mutual transfer conductance of the second P-MOSFET.

According to the conventional circuit for producing a constant voltage, however, there is a disadvantage that a range of an output voltage is narrow, as understood from reasons to be described later.

Further, there is a disadvantage that the output voltage $V_s$ fluctuates in accordance with the threshold voltages $V_{T1}$ and $V_{T2}$ changed dependent on the conditions of the fabricating process of MOSFETs, as understood from the equation (1).

SUMMARY OF THE INVENTION

Accordingly, an object of the invention is to provide a circuit for producing a constant voltage from which a wide range of a constant output voltage is supplied.

A further object of the invention is to provide a circuit for producing a constant voltage in which a constant voltage is produced without being affected by a threshold voltage of MOSFETs.

According to the invention, a circuit for producing a constant voltage comprises first and second MOSFETs connected in series and each having one conduction type, and bias means connected between gate and drain of each MOSFET. The bias means produces potential differences equal to threshold voltages of the first and second MOSFETs, so that a wide range of an output voltage is produced at a connecting point between the first and second MOSFETs, and a stabilized output voltage does not change in level, even if the threshold voltages change in a semiconductor device fabricating process.

BRIEF DESCRIPTION OF DRAWINGS

The invention will be explained in more detail in conjuction with appended drawings; wherein.

DESCRIPTION OF PREFERRED EMBODIMENTS

Before explaining a circuit for producing a constant voltage in the first and second embodiments according to the invention, the aforementioned conventional circuit for producing a constant voltage will be explained in conjunction with FIGS. 1 to 4.

Figure 1:
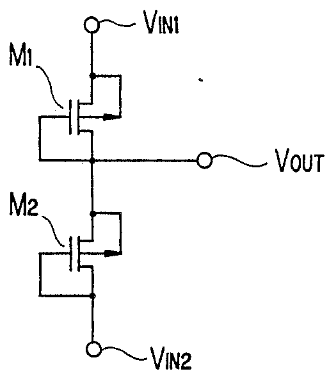
FIG. 1 PRIOR ART
FIG. 1 is a circuitry diagram of a conventional circuit for producing a constant voltage including two P-MOSFETs connected in series.

FIG. 1 shows a structure of the conventional circuit in which the first and second P-MOSFETs $M_1$ and $M_2$ are connected in series. In the circuit, the source and the gate of the first P-MOSFET $M_1$ are respectively connected to the source and the substrate potential of the second P-MOSFET $M_2$, the source and the substrate potential of the first P-MOSFET $M_1$ is connected to the first voltage input terminal $V_{IN1}$, the gate and the drain of the second P-MOSFET is connected to the second voltage input terminal $V_{IN2}$, and the connecting point between the gate and the drain of the P-MOSFET $M_1$ and the source and the substrate potential of the P-MOSFET $M_2$ is connected to the output terminal $V_{OUT}$.

Figure 2:
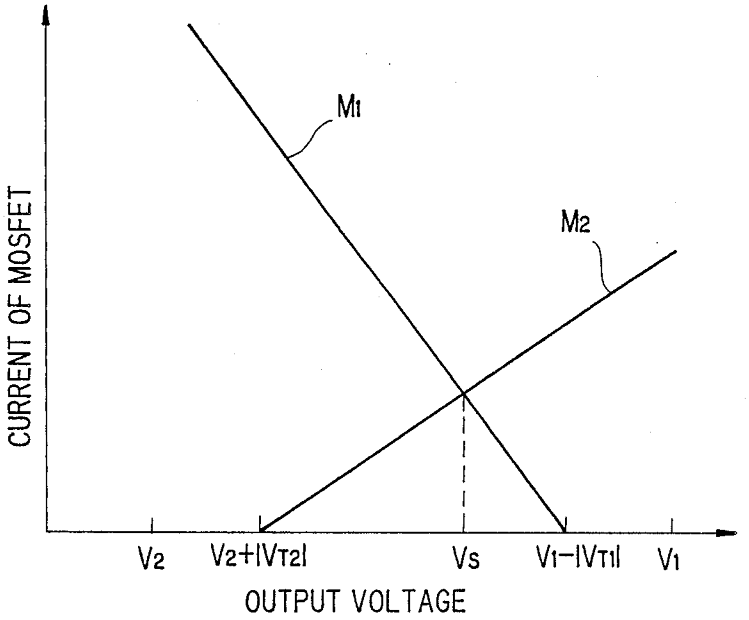
FIG. 2 PRIOR ART
FIG. 2 to 4 are graphical diagrams showing currents of the two P-MOSFETs relative to an output voltage of the conventional circuit, respectively.

FIG. 2 shows the currents flowing through the P-MOSFETs $M_1$ and $M_2$ in the circuit for producing a constant voltage relative to an output voltage at the output terminal $V_{OUT}$. When the threshold voltages of the first and second P-MOSFETs $M_1$ and $M_2$ are $V_{T1}$ and $V_{T2}$, and the input voltages $V_1$ and $V_2$ are applied to the input terminals $V_{1N1}$ and $V_{1N2}$ as explained before, no current flows through the first P-MOSFET $M_1$ when the output voltage ranges $V_1-|V_{T1}|$ to $V_1$, and a current flows through the first P-MOSFET $M_1$ in reversely proportional to the output voltage when it is below $V_1-|V_{T1}|$, while no current flows through the second P-MOSFET $M_2$ when the output voltage ranges $V_2$ to $V_2+|V_{T2}|$, and a current flows through the second P-MOSFET $M_2$ in proportional to the output voltage when it is above $V_2+|V_{T2}|$. When the currents flowing through the P-MOSFETs $M_1$ and $M_2$ are equal to each other, the stabilized output voltage $V_s$ is obtained at the output terminal $V_{out}$. The level of the stabilized output voltage $V_s$ is determined in accordance with the aforementioned equation (1).

Figure 3:
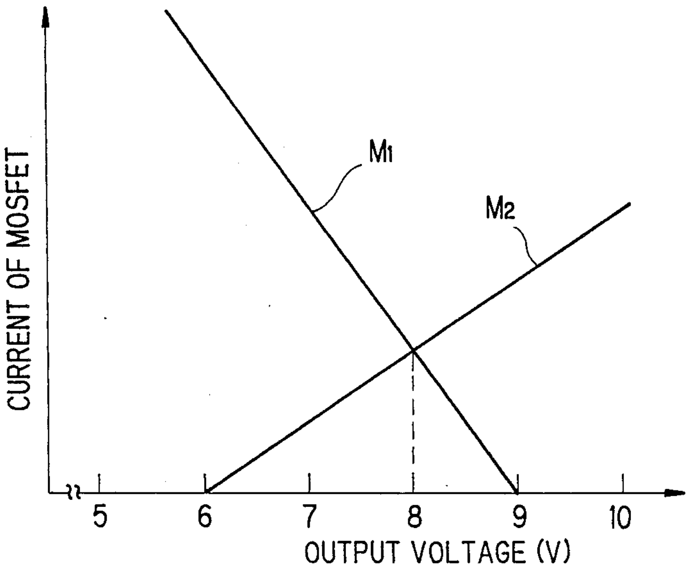
FIG. 3 PRIOR ART
Figure 4:
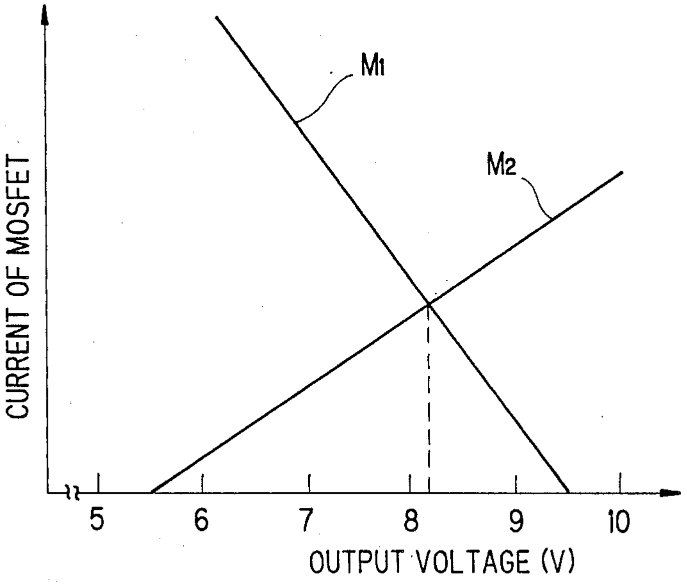
FIG. 4 PRIOR ART

Here, it is assumed that the input voltage $V_1$ is 10 V, the input voltage $V_2$ is 5 V, the threshold voltages $V_{T1}$ and $V_{T2}$ are $-1$ V, and the ratio of the mutual transfer conductances $g_{m1}$ and $g_{m2}$ is 2/1. Thus, lines $M_1$ and $M_2$ indicating currents flowing through the first and second P-MOSFETs $M_1$ and $M_2$ relative to the output voltage at the output terminal $V_{OUT}$ are obtained as shown in FIG. 3, so that the stabilized output voltage $V_s$ is 8 V. In this situation, the lines $M_1$ and $M_2$ changes as shown in FIG. 4, where the threshold voltages $V_{T1}$ and $V_{T2}$ of the first and second P-MOSFETs $M_1$ and $M_2$ change from $-1$ V to $-0.5$ V, so that the stabilized output voltage $V_s$ changes from 8 V to 8.17 V. This is one of the aforemention disadvantages. Further, it is clearly understood from FIG. 2 that a range of the output voltage at the output terminal $V_{OUT}$ is narrow. This is the other disadvantage. These disadvantages are overcome in a circuit for producing a constant voltage according to the invention.

Next, a circuit for producing a constant voltage in the first embodiment according to invention will be explained in conjunction with FIGS. 5 and 6.

Figure 5:
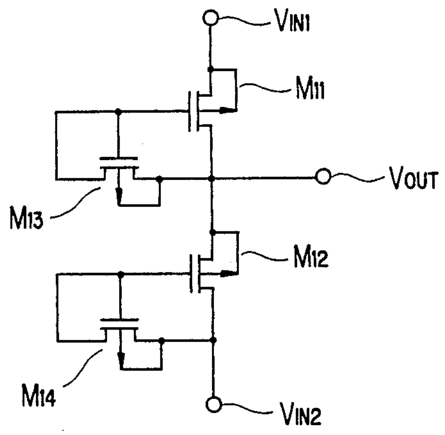
FIG. 5 is a circuitry diagram of a circuit for producing a constant voltage in a first embodiment according to the invention.
Figure 6:
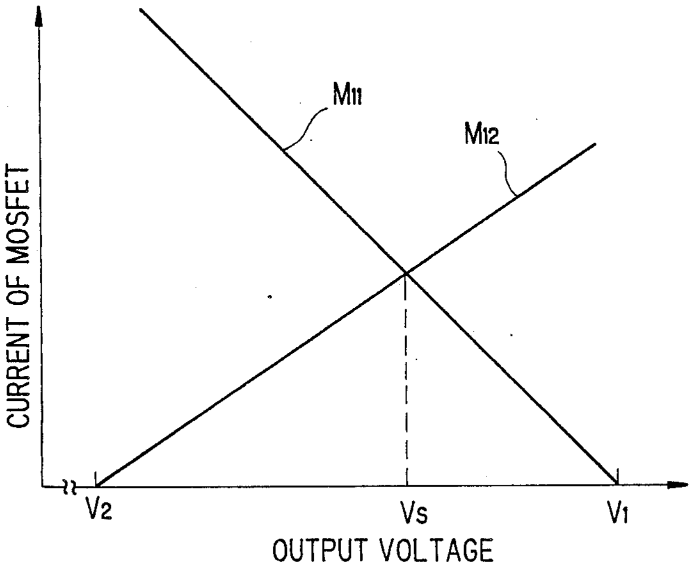
FIG. 6 is a graphical diagram showing currents of two P-MOSFETs connected in series in the circuit of the first embodiment relative to an output voltage of the circuit.

In FIG. 5, there is shown the circuit for producing a constant voltage which comprises P-MOSFETs $M_{11}$, $M_{12}$, $M_{13}$ and $M_{14}$. In the circuit, the P-MOSFETs $M_{11}$ and $M_{12}$ are connected in series between first and second voltage input terminals $V_{1N1}$ and $V_{1N2}$, source and substrate potential of the P-MOSFET $M_{13}$ are connected to drain of the P-MOSFET $M_{11}$, gate and drain of the P-MOSFET $M_{13}$ are connected to gate of the P-MOSFET $M_{11}$, source and substrate potential of the P-MOSFET $M_{14}$ are connected to drain of the P-MOSFET $M_{12}$, gate and drain of the P-MOSFET $M_{14}$ are connected to gate of the P-MOSFET $M_{12}$, and a connecting point of the P-MOSFETs $M_{11}$ and $M_{12}$ is connected to an output terminal $V_{OUT}$.

In operation, input voltages $V_1$ and $V_2$ are applied to the first and second voltage input terminals $V_{1N1}$ and $V_{1N2}$. Here, it is assumed that threshold voltages of the P-MOSFETs $M_{11}$, $M_{12}$, $M_{13}$ and $M_{14}$ are equal to each other to be "$V_{TH}$". Thus, a gate voltage $V_{G11}$ of the P-MOSFET $M_{11}$ is obtained in the presence of the P-MOSFET $M_{13}$ as follows.

$$V_{G11}=V_{D11}-|V_{TH}| \quad (2)$$

where $V_{D11}$ is a drain voltage of the P-MOSFET $M_{11}$. Then, a current flowing through the P-MOSFET $M_{11}$ is indicated by a line $M_{11}$ in FIG. 6, and is reversely proportional to the drain voltage $V_{D11}$ equal to an output voltage at the output terminal $V_{OUT}$, where the output voltage is below the first input voltage $V_1$. On the other hand, a gate voltage $V_{G12}$ of the P-MOSFET $M_{12}$ is obtained in the presence of the P-MOSFET $M_{14}$ as follows.

$$V_{G12}=V_{D12}-|V_{TH}| \quad (3)$$

where $V_{D12}$ is a drain voltage of the P-MOSFET $M_{12}$. Then, a current flowing through the P-MOSFET $M_{12}$ is indicated by a line $M_{12}$ in FIG. 6, and is proportional to a source voltage equal to the output voltage, where the output voltage is above the second input voltage $V_2$. The stabilized output voltage $V_s$ is obtained from a crossing point of the lines $M_{11}$ and $M_{12}$, and is determined in accordance with the equation (4).

$$V_s = V_2 + (V_1 - V_2) \times \frac{g_{m11}}{g_{m11} + g_{m12}} \quad (4)$$

where $g_{m11}$ is a mutual transfer conductance of the P-MOSFET $M_{11}$, and $g_{m12}$ is a mutual transfer conductance of the P-MOSFET $M_{12}$.

As understood from the equation (4), the output voltage at the output terminal $V_{OUT}$ can be arbitrarily set, in the range between the voltages $V_1$ and $V_2$ applied to the first and second voltage input terminals $V_{1N1}$ and $V_{1N2}$, in accordance with the setting of the mutual transfer conductances $g_{m11}$ and $g_{m12}$. Even more, the output voltage does not change under the conditions that the threshold voltages of the P-MOSFETs $M_{11}$, $M_{12}$, $M_{13}$ and $M_{14}$ are equal to each other, even if the threshold voltages change.

Figure 7:
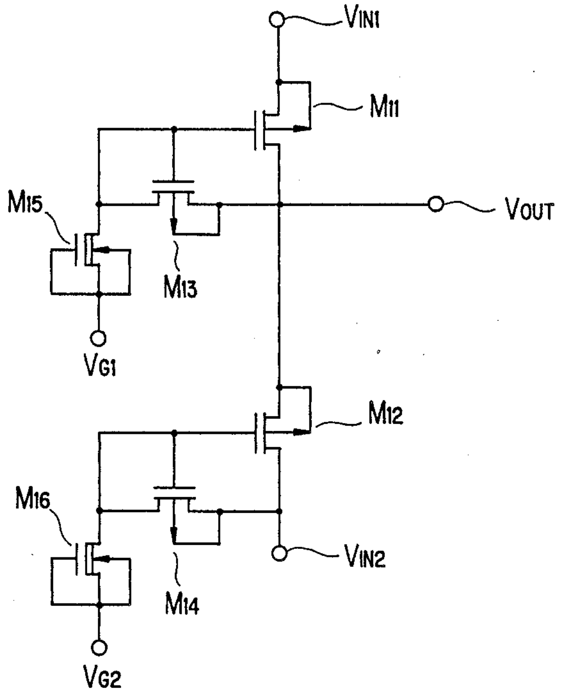
FIG. 7 is a circuitry diagram of a circuit for producing a constant voltage in a second embodiment according to the invention.

In FIG. 7, there is shown a circuit for producing a constant voltage in the second embodiment according to the invention, wherein like parts are indicated like reference symbols in the first embodiment. In the circuit, first and second P-MOSFETs $M_{11}$ and $M_{12}$ are connected in series between first and second voltage input terminals $V_{1N1}$ and $V_{1N2}$, source and substrate potential of P-MOSFET $M_{13}$ are connected to drain of the P-MOSFET $M_{11}$, gate and drain of the P-MOSFET $M_{13}$ are connected to gate of the P-MOSFET $M_{11}$, source and substrate potential of P-MOSFET $M_{14}$ are connected to drain of the P MOSFET $M_{12}$, and gate and drain of the P-MOSFET $M_{14}$ are connected to gate of the P-MOSFET $M_{12}$. In the circuit, further, drain of N type depletion MOSFET $M_{15}$ is connected to a connecting point between the gate of the P-MOSFET $M_{11}$ and the gate and the drain of the P-MOSFET $M_{13}$, gate and source of the N type depletion MOSFET $M_{15}$ are connected to a ground potential terminal $V_{G1}$ connected to the ground potential, drain of N type depletion MOSFET $M_{16}$ is connected to a connecting point between the gate of the P-MOSFET $M_{12}$ and the gate and the drain of the P-MOSFET $M_{14}$, gate and source of the N type depletion MOSFET $M_{16}$ are connected to a ground potential terminal $V_{G2}$ connected to the ground potential, and a connecting point between the first and second P-MOSFETs $M_{11}$ and $M_{12}$ is connected to an output terminal $V_{OUT}$.

In operation, the same characteristic of an output voltage as that in the first embodiment is obtained at the output terminal $V_{OUT}$. Even more, minute currents flow from the connecting point between the gate of the P-MOSFET $M_{11}$ and the gate and the drain of the P-MOSFET $M_{13}$ and the connecting point between the gate of the P-MOSFET $M_{12}$ and the gate and the drain of the P-MOSFET $M_{14}$ through the N type depletion MOSFETs $M_{15}$ and $M_{16}$ to the ground potential terminals $V_{G1}$ and $V_{G2}$, respectively, where the first and second voltages $V_1$ and $V_2$ applied to the input terminals $V_{IN1}$ and $V_{IN2}$ fluctuate, so that the gates of the P-MOSFETs $M_{11}$ and $M_{12}$ are under a floating state, thereby avoiding an operation instability of the circuit.

In a circuit for producing a constant voltage according to the invention, as explained above, first and second MOSFETs each having one conduction type are connected in series between first and second voltage sources, and bias means is connected between gate and drain of each MOSFET, wherein the bias means produces a potential difference equal to a threshold voltage of each MOSFET, so that a wide range of an output voltage can be produced, and an output voltage characteristic is maintained to be constant, even if a threshold voltage changes in a semiconductor device fabricating process.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A circuit for producing a constant voltage: comprising, first and second MOSFETs connected in series and each having one conduction type;

bias means connected between gate and drain for each of said first and second MOSFETs; and first and second voltage sources connected to said first and second MOSFETs, respectively;

wherein said bias means produces potential differences equal to threshold levels of a MOSFET, whereby a wide range of a stabilized output voltage is produced at a connecting point of said first and second MOSFETs.

2. A circuit for producing a constant voltage according to claim 1, wherein each of said first and second MOSFETs is such that substrate potential is equal to source potential; and said bias means includes third and fourth MOSFETs each having said one conduction type;

source and substrate of said third MOSFET being connected to said drain of said first MOSFET, and drain and gate of said third MOSFET being connected to said gate of said first MOSFET; and source and substrate of said fourth MOSFET being connected to said drain of said second MOSFET, and drain and gate of said third MOSFET being connected to said gate of said second MOSFET.

3. A circuit for producing a constant voltage according to claim 2, further, comprising, means for floating said gates of said first and second MOSFETs when first and second voltages of said first and second voltage sources fluctuate.

4. A circuit for producing a constant voltage according to claim 3, wherein said means for floating includes first and second N type depletion MOSFETs;

drain of said first N type depletion MOSFET being connected to a connecting point of said drain and said gate of said third MOSFET, and source and gate of said first N type depletion MOSFET being connected to a ground potential; and drain of said second N type depletion MOSFET being connected to a connecting point of said drain and said gate of said fourth MOSFET, and source and gate of said second N type depletion MOSFET being connected to a ground potential.

* * * * *